United States Patent
Shibagaki et al.

(10) Patent No.: US 8,691,676 B2
(45) Date of Patent: Apr. 8, 2014

(54) SUBSTRATE HEAT TREATING APPARATUS, TEMPERATURE CONTROL METHOD OF SUBSTRATE HEAT TREATING APPARATUS, MANUFACTURING METHOD OF SEMICONDUCTOR DEVICE, TEMPERATURE CONTROL PROGRAM OF SUBSTRATE HEAT TREATING APPARATUS, AND RECORDING MEDIUM

(75) Inventors: Masami Shibagaki, Kawasaki (JP); Kaori Mashimo, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 13/808,338

(22) PCT Filed: Aug. 3, 2011

(86) PCT No.: PCT/JP2011/004390
§ 371 (c)(1),
(2), (4) Date: Jan. 4, 2013

(87) PCT Pub. No.: WO2012/020556
PCT Pub. Date: Feb. 16, 2012

(65) Prior Publication Data
US 2013/0109109 A1 May 2, 2013

(30) Foreign Application Priority Data
Aug. 9, 2010 (JP) ................. 2010-178458

(51) Int. Cl.
*H01L 21/265* (2006.01)
*H01L 21/425* (2006.01)
(52) U.S. Cl.
USPC ............ 438/518; 438/522; 438/530; 392/416
(58) Field of Classification Search
None
See application file for complete search history.

(56) References Cited

U.S. PATENT DOCUMENTS

| 7,320,733 | B2 | 1/2008 | Haga |
| 7,586,730 | B2 | 9/2009 | Haga |
| 7,897,523 | B2 | 3/2011 | Shibagaki et al. |
| 7,968,828 | B2 | 6/2011 | Haga |
| 8,187,958 | B2 | 5/2012 | Shibagaki et al. |
| 2012/0219921 | A1 | 8/2012 | Shibagaki et al. |

FOREIGN PATENT DOCUMENTS

| JP | 60-247936 A | 12/1985 |
| JP | 8-37158 A | 2/1996 |
| JP | 2000-232108 A | 8/2000 |
| JP | 2002-324802 A | 11/2002 |
| JP | 2005-056582 A | 3/2005 |
| JP | 2005-056964 A | 3/2005 |
| JP | 2009-206503 A | 9/2009 |

*Primary Examiner* — Scott B Geyer
(74) *Attorney, Agent, or Firm* — Fitzpatrick, Cella, Harper & Scinto

(57) ABSTRACT

To provide a temperature control method capable of equivalently maintaining qualities of substrates even when treated substrates are continuously carried in a treatment container in the case in which activation annealing treatment is performed by an electron impact heating method. The temperature control method of a substrate heat treating apparatus performing annealing treatment of a substrate by an electron impact heating method includes performing preheating for heating the inside of a treating chamber 2a at a higher temperature than the annealing treatment temperature of a substrate 21 and over a longer period of time than the annealing treatment time and then, cools the inside of the treatment container to a temperature lower than the annealing treatment temperature, prior to carrying the substrate 21 in a vacuum exhaustible container 3 and carrying the substrate 21 in the preheated vacuum exhaustible treatment container 3 and then, increasing a temperature of the treatment container to the annealing treatment temperature to perform the annealing treatment.

6 Claims, 3 Drawing Sheets

SUBSTRATE HEAT TREATING APPARATUS, TEMPERATURE CONTROL METHOD OF SUBSTRATE HEAT TREATING APPARATUS, MANUFACTURING METHOD OF SEMICONDUCTOR DEVICE, TEMPERATURE CONTROL PROGRAM OF SUBSTRATE HEAT TREATING APPARATUS, AND RECORDING MEDIUM

TECHNICAL FIELD

The present invention relates to a substrate heat treating apparatus used in a heat treating process of a semiconductor device, a temperature control method of the substrate heat treating apparatus, a manufacturing method of a semiconductor device using the same, a temperature control program of the substrate heat treating apparatus, and a recording medium with the program thereon.

BACKGROUND ART

A silicon carbide (SiC) substrate has a very small thermal diffusion coefficient of impurities and cannot practically use a thermal diffusion process of impurities. For this reason, in order to control electrical conductivity of the SiC substrate, there is a need to activate impurities by performing ion implantation of the impurities into the SiC substrate and annealing treatment of the SiC substrate at about 1500° C. to about 2000° C.

Prior to performing the activation annealing treatment, the inside of a furnace is preheated so as to increase the inside of the furnace to a predetermined temperature. For example, Patent Literature 1 discloses a technology of preheating the inside of a furnace followed by carrying a treated substrate in a heating furnace and carrying the treated substrate in the furnace after the inside of the furnace reaches a predetermined temperature, in a method for performing annealing treatment on the treated substrate with a halogen lamp.

Further, Patent Literature 2 discloses a technology of ending preheating when a heating-up time is within a predetermined value, in performing the preheating by repeating a series of processes which a dummy substrate is carried in and out of a lamp anneal apparatus by the real processes.

PRIOR ART REFERENCE

Patent Literature

Patent Literature 1: Japanese Patent Application Laid-Open NO. 60-247936
Patent Literature 2: Japanese Patent Application Laid-Open No. 8-37158

SUMMARY OF THE INVENTION

Problem to be Solved by the Invention

However, in the case of performing the activation annealing treatment on the treated substrate at a high temperature with an electron impact heating apparatus, even though the inside of the furnace is preheated at a predetermined temperature, qualities of a first sheet of substrate and a substrate after a second sheet may be different from each other when the treated substrates are continuously carried in the inside of the furnace.

The difference in the qualities of the substrates is considered as a peculiar problem due to the electron impact heating method. That is, the electron impact heating method applies acceleration voltage from an acceleration power supply to thermal electrons generated from a filament within a vacuum heating container and brings about the collision of the accelerated thermal electrons to heat the heating container, thereby heating the treated substrates using the radiated heat. Therefore, when the preheating technology using the lamp heating method disclosed in Patent Literatures 1 and 2 are applied as it is, there is a problem in that the difference in qualities of the substrates occurs.

Therefore, an object of the present invention is to provide a substrate heat treating apparatus capable of equivalently maintaining qualities of substrates even when treated substrates are continuously carried in a treatment container, in performing activation annealing treatment by an electron impact heating method.

Another object of the present invention is to provide a temperature control method of a substrate heat treating apparatus capable of achieving the object, a manufacturing method of a semiconductor device, a temperature control program of the substrate heat treating apparatus, and a recording medium with the program thereon.

Means for Solving the Problem

A configuration of the present invention for achieving the above objects is as follows.

That is, the present invention provides a temperature control method of a substrate heat treating apparatus including a conductive heating container mounted with a filament within a vacuum exhaustible treatment container and applying acceleration voltage between the filament and the heating container to accelerate thermal electrons generated from the filament and making collision of the accelerated thermal electrons with the heating container to heat the heating container, and performing annealing treatment on the substrate by heat generated from the heating container, the temperature control method including: performing preheating for heating the treatment container at a higher temperature than an annealing treatment temperature of the substrate and over a longer period of time than an annealing treatment time and then, cools the inside of the treatment container to a temperature lower than the annealing treatment temperature, prior to carrying the substrate in the treatment container; and carrying the substrate in the preheated treatment container and then, increasing a temperature of the treatment container to the annealing treatment temperature to perform the annealing treatment.

Effects of the Invention

According to the present invention, when the activation annealing treatment is performed at the high temperature by using the electron impact heating apparatus, it is possible to equivalently maintain the qualities of the substrates even when the treated substrates are continuously carried in the treatment container.

MODE FOR CARRYING OUT THE INVENTION

Hereinafter, embodiments of the present invention will be described with reference to the drawings, but the present invention is not limited to the present embodiments.

Figure 1:
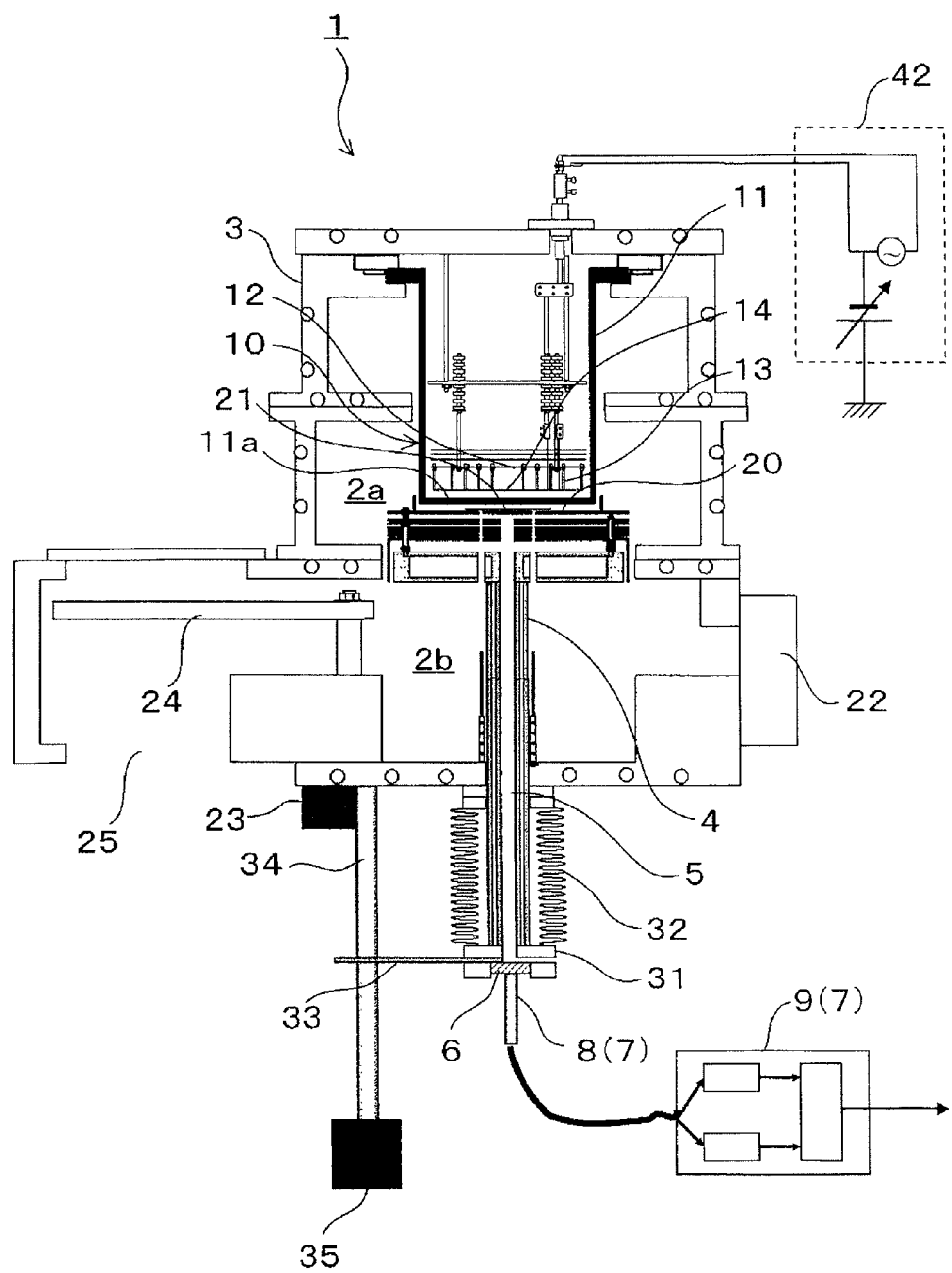
FIG. 1 is a schematic diagram schematically illustrating the overall configuration of an electron impact heating apparatus to which a temperature control method according to the present invention is applied.

First, an aspect of a substrate heat treating apparatus (hereinafter, referred to as 'electron impact heating apparatus') using an electron impact heating method to which the present invention is applied will be described with reference to FIG. 1. FIG. 1 is a schematic diagram schematically illustrating the overall configuration of an electron impact heating apparatus.

An electron impact heating apparatus 1 according to the present embodiment is an apparatus that applies acceleration voltage from an acceleration power supply 42 to thermal electrons generated from a filament 14, makes collision of the accelerated thermal electrons with a heating container 11 to heat the heating container 11, and performs heat treating on a treated substrate 21 disposed to face a radiating surface 11a. The electron impact heating apparatus 1 includes a vacuum exhaustible treatment container 3 that is partitioned by vertically communicating a treating chamber 2a in which the treated substrate 21 is heat treated and a waiting chamber 2b. The inside of the treating chamber 2a on an upper portion of the electron impact heating apparatus 1 is provided with a heating apparatus (hereinafter, referred to as 'heater') 10 mounted with the filament 14.

The heater 10 is configured of the cylindrical heating container 11 of which one end is closed, a filament base 12 received therein, a support pillar 13, and the filament 14.

The filament 14 is extendedly disposed to be approximately parallel with a closed section (radiating surface) 11a of the heating container 11 by the support pillar 13 made of tantalum and having a diameter of φ 2 mm that stands on the filament base 12 made of, for example, a carbon fiber reinforced composite (hereinafter, referred to as 'CC composite').

As the filament 14, for example, a tungsten rhenium line or a tungsten line to which potassium and rare earths such as lanthanum, and the like, are added are used and the filament having a diameter of φ 0.8 mm and a length of 900 mm is used.

The heating container 11 is formed of a conductor. In detail, an outer surface of the heating container 11 is coated with, for example, pyrolytic carbon so as to reduce emission gas. The heating container 11 is connected with a vacuum exhaust unit (not illustrated) and the inside thereof is configured to perform vacuum exhaust independently from the treatment container 3.

Further, a substrate stage 20 made of the CC composite is disposed to face the heating plate (radiating surface) 11a of the closed section of the heating container 11. A treated substrate (wafer) 21 is mounted on the substrate stage 20 so as to face the heater 10. In the present embodiment, as the treated substrate 21, for example, a silicon carbide (SiC) substrate is adopted, but the present embodiment is not limited thereto.

The substrate stage 20 is supported by the cylindrical support pillar 4 and a tip of a through hole 5 of the support pillar 4 is connected with a dichroic radiation thermometer 7, with a viewing port 6 made of quartz interposed therebetween. The viewing port 6 closes a vacuum space to partition a vacuum state and an atmosphere state. Light radiated from the substrate stage 20 or the SiC substrate 21 reaches the dichroic radiation thermometer 7 via the viewing port 6.

The dichroic radiation thermometer 7 is configured of, for example, a light collector 8 and a detector 9 and is configured to indirectly measure a temperature of the heater 10, with the substrate stage 20 made of the CC composite interposed therebetween. The temperature measurement is not limited to the temperature measurement of the substrate stage 20 and the temperature of the radiating surface 11a or the heating container 11 may be measured.

A lower end of the support pillar 4 is fixed with a support plate 31 and a bellows 32 is interposed between the support plate 31 and the treatment container 3. Further, the support plate 31 is fixed with an elevation arm 33 formed with a screw hole (not illustrated) and the screw hole of the elevation arm 33 is fitted with a ball screw 34 that is connected with a rotation driving device 35. That is, the rotation driving device 35 rotates the ball screw 34, such that the elevation arm 33 can be elevated along the ball screw 34 and the substrate stage 20 connected to the elevation arm 33, with the support pillar 4 interposed therebetween, and the like, can be elevated. That is, the bellows 32, the elevation arm 33, the ball screw 34, and the rotation driving device 35 configure main components of the substrate stage elevation device for approaching or spacing the substrate stage 20 to and apart from the radiating surface 11a of the heating container 11. In the present embodiment, the substrate stage 20 maybe elevated, but any one of the substrate stage 20 and the heater 10 may be elevated.

The inside of the treatment container 3 is vacuum-exhausted by an exhaust device (not illustrated) that is connected with an exhaust port 25. Further, one side wall of the waiting chamber 2b of the treatment container 3 is provided with a slit valve 22 and the slit valve 22 is opened, such that the substrate 21 is carried in the treatment container 3 or carried out of the treatment container 3 by a carrying robot (not illustrated). Further, a water cooling shutter mechanism (hereinafter, referred to as 'shutter') 24 that is connected with the rotation device 23 is rotatably mounted in a horizontal direction in the waiting chamber 2b of the treatment container 3. The shutter 24 is inserted between the substrate stage 20 and the radiating surface 11a of the heating container 11 when the substrate stage 20 is retreated into the waiting chamber 2b to block the substrate 21 from the radiating surface 11a.

Figure 3:
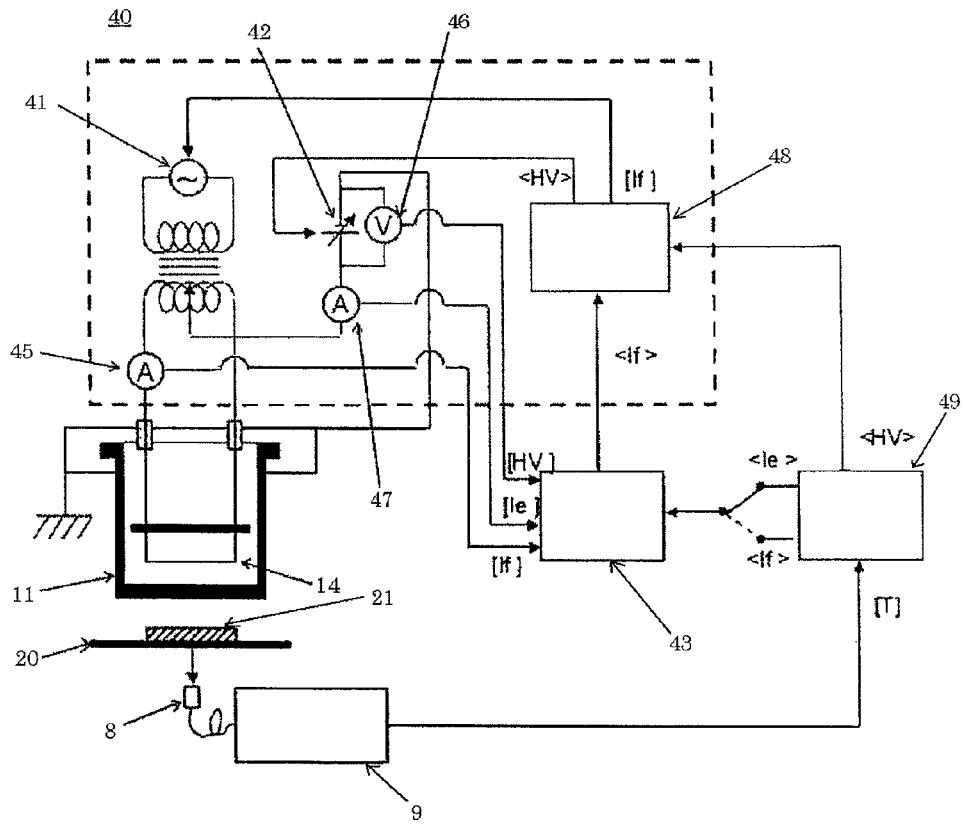
FIG. 3 is a schematic diagram illustrating a configuration of a control system of the electron impact heating apparatus of FIG. 1.

Next, an aspect of a configuration of a control system included in the electron impact heating apparatus of FIG. 1 will be described with reference to FIG. 3. FIG. 3 is a schematic diagram illustrating a configuration of a control system of an electron impact heating apparatus.

As illustrated in FIG. 3, a control system 40 according to the present embodiment includes a filament power supply, an acceleration power supply, an acceleration voltmeter, a filament ampere meter, an emission ampere meter, a heating power supply including a thyristor, a multi-functional temperature control system, a sequencer, a pyrometer light collector, and a pyrometer body.

The filament power supply 41 is an AC power supply that supplies power for heating the filament 14 and can variably apply, for example, a current of a maximum of 50 A (ampere). A connection circuit of the filament 14 is connected with the filament ampere meter 45 to measure a current value of the filament 14.

The acceleration power supply (HV power supply) 42 is an DC power supply that applies the acceleration voltage between the grounded heating container 11 and the filament 14 and can variably apply the acceleration voltage to the filament 14, for example, from 0 V to −3.0 KV. The connection circuit of the acceleration power supply 42 is connected with an acceleration voltmeter (HV voltmeter) 46 that measures the acceleration voltage and an emission ampere meter 47 that measures an emission current value.

As the multi-functional temperature control system 43, for example, SDC-46A available from Sanbu Corporation is adopted. The temperature control system 43 receives an input signal from the filament ampere meter 45, an input signal from the emission ampere meter 47, and an input signal from the acceleration voltmeter 46 and receives a set value from a sequencer 49. The set value of the sequencer 49 is also input to a thyristor 48. Further, the multi-functional temperature control system 43 is configured to transmit an output signal to the filament power supply 41 via the thyristor 48.

Figure 2:
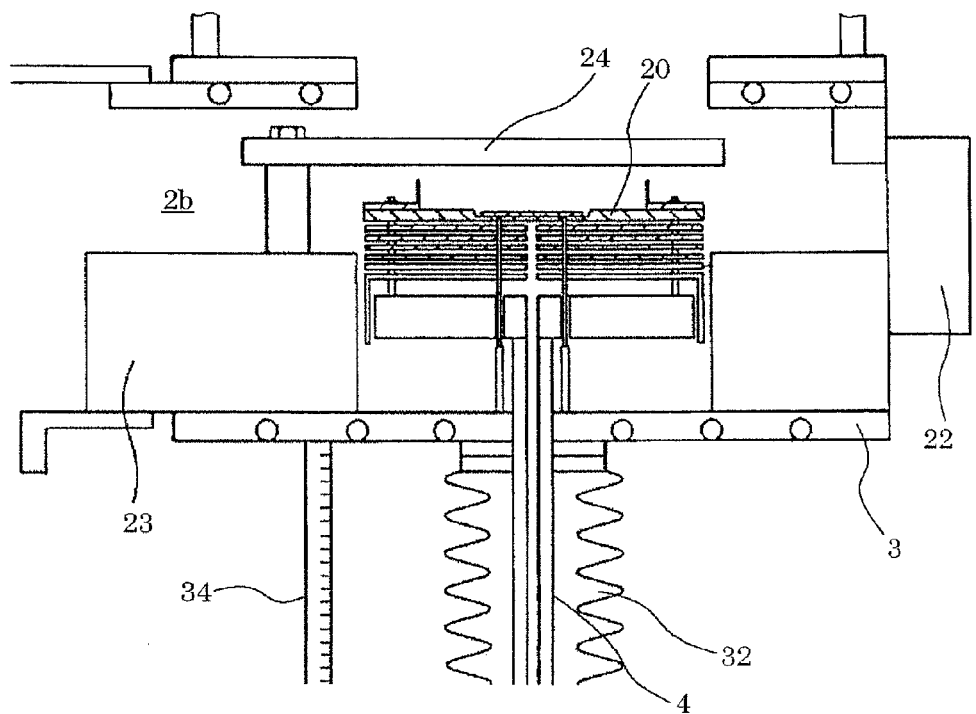
FIG. 2 is a schematic diagram illustrating a state in which a substrate stage of the electron impact heating apparatus of FIG. 1 descends.
Figure 4:
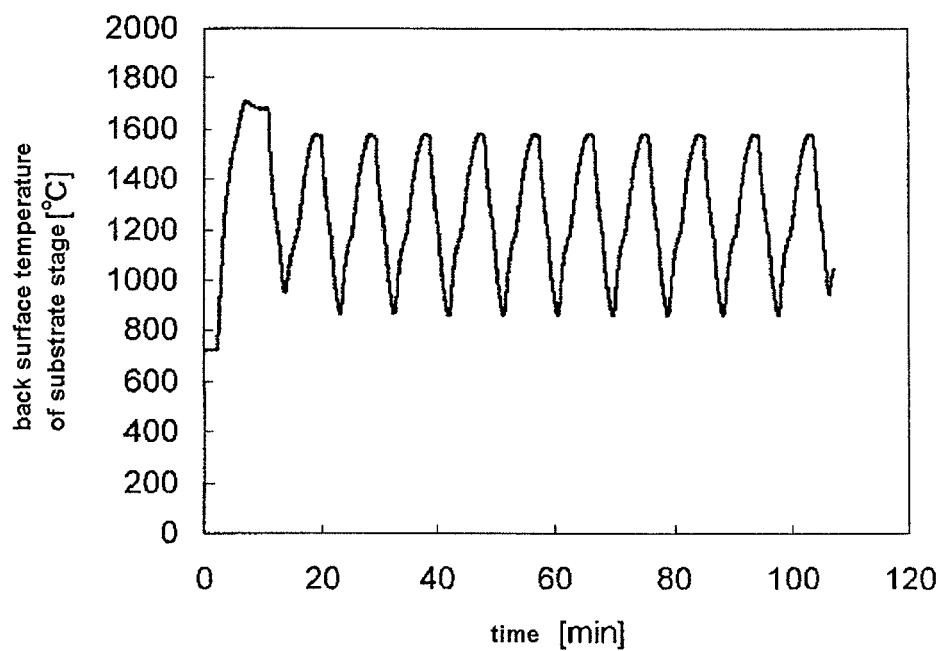
FIG. 4 is an explanation diagram illustrating a relationship between a back surface temperature and a treating time of the preheated substrate stage, in the temperature control method according to the present embodiment.

Next, a temperature control method including preheating according to the present embodiment that is applied to the electron impact heating apparatus 1 will be described with reference to FIGS. 2 to 4. FIG. 2 is a schematic diagram illustrating a state in which the substrate stage of the electron impact heating apparatus of FIG. 1 descends. FIG. 4 is an explanation diagram illustrating a relationship between a back surface temperature and a treating time of the substrate stage, in the preheating of the temperature control method according to the present embodiment.

An algorithm of the temperature control method including the preheating according to the present invention is stored in a storage unit of a control device (PC) connected with the control system 40 as a temperature control program and is read and executed by a CPU at the time of starting the preheating.

Here, the temperature control program is a program that allows the control device to execute the temperature control of the heater 10, based on a detection signal of the back surface temperature of the substrate stage. That is, the temperature control program of the present embodiment has an order of performing the preheating for heating the inside of the treatment container at a higher temperature than the annealing treatment temperature of the substrate and over a longer period of time than the annealing treatment time and then, cools the inside of the treatment container to a temperature lower than the annealing treatment temperature, prior to carrying the substrate in the treatment container. Further, the temperature control program has an order of carrying the substrate in the preheated treatment container and then, increasing a temperature of the treatment container to the annealing treatment temperature to perform the annealing treatment.

The temperature control program is recorded in a recording medium that can be read by a control device such as a computer (PC), and the like, and is installed in the storage unit of the PC.

An example of the recording medium may include a floppy (registered trademark) disk, a magnetic recording medium, such as a ZIP (registered trademark), and the like, a magneto-optical recording medium such as MO, and the like, an optical disk such as CD-R, DVD-R, DVD+R, DVD-RAM, DVD+RW (registered trademark), PD, and the like. Further, an example of the recording medium may include a flash memory system such as a compact flash (registered trademark), a smart media (registered trademark), a memory stick (registered trademark), an SD card, and the like, a removable disk such as a micro drive (registered trademark), Jaz (registered trademark), and the like.

The temperature control method according to the present invention includes a process of heating the inside of the treatment container at a higher temperature than the annealing treatment temperature of the substrate and over a longer period of time than the annealing treatment time and then, cooling the inside of treatment container to a temperature lower than the annealing treatment temperature, prior to carrying the substrate in the treatment container.

Here, in the 'annealing treatment temperature', the 'heating the inside of the treatment container at the higher temperature than the annealing treatment temperature', and the 'cooling the inside of the treatment container to a temperature lower than the annealing treatment temperature', each temperature is determined as the temperature at the same measurement location within the treatment container. In detail, each temperature is determined by measuring the back surface temperature of the substrate stage or the temperature of the heating container and it is preferable to measure the back surface temperature of the substrate stage at a point more approaching the substrate.

As described above, the temperature control method according to the present embodiment performs the preheating process on the inside of the treatment container including the heater 10 and the substrate stage 20 at the higher temperature than the real annealing treatment temperature and over the longer period of time than the annealing treatment time, prior to carrying the treated substrate 21 in the treatment container 3. Further, the temperature control method is a method of carrying the treated substrate 21 in the treatment container 3 by the carrying robot and performing the real annealing treatment process, after the preheating process ends. In detail, the substrate stage 20 rises without mounting a dummy substrate on the substrate stage 20 to reduce a distance (for example, up to 5 mm) between an upper surface of the stage 20 and the radiating surface 11a of the closed end of the heating container 11. Further, the preheating is performed by controlling the back surface temperature of the substrate stage so as to be the higher temperature (for example, 1700° C.) than the real annealing treatment temperature (for example, 1575° C.) and holding the heating container over the longer period (for example, 4 minutes) time than the annealing treatment time (for example, 1 minute).

The temperature control method including the preheating process according to the present embodiment will be described with reference to FIGS. 3 and 4.

First, absorption gas is emitted to the filament 14 by heating the filament and the deterioration in the filament 14 is prevented. In detail, a signal is input to the multi-functional temperature control system 43 from the sequencer 49 and a filament current value is slowly increased until the current value of the filament ampere meter 45 reaches the set value (for example, 30 A). The multi-functional temperature control system 43 compares the signal from the sequencer 49 with a return signal from the filament ampere meter 45 to output the signal to the thyristor 48. The filament power supply 41 slowly increases the output of the filament current value according to the input of the thyristor 48 and heats the filament 14 until the current value of the filament ampere meter 45 reaches 30 A.

Next, voltage is slowly increased by applying the acceleration voltage (HV) from the acceleration power supply 42 to the filament 14 to prevent the emission current value from suddenly increasing and the abnormal discharge. In detail, the signal is output from the sequencer 49 to the thyristor 48 and the acceleration voltage (HV) of the set voltage (for example, −500 V) is applied in the state in which the filament current value is fixed as the set value (for example, 30 A). The acceleration power supply 42 applies the acceleration voltage (HV) of −500 V to the filament 14 according to the input from the thyristor 48. Further, the sequencer 49 outputs the signal to the thyristor 48 and slowly increases the acceleration voltage (HV) so that the acceleration voltage (HV) is the set voltage (for example, −1800 V). The acceleration power supply 42 slowly increases the output of the acceleration voltage (HV) according to the input of the thyristor 48 and generates the emission current so that the acceleration voltage (HV) is −1800 V.

Further, the signal is input from the sequencer 49 to the multi-functional temperature control system 43 so that the emission current value is the set value (for example, 10.7 A). In detail, the multi-functional temperature control system 43 compares the signal from the sequencer 49 with the output signal from the emission ampere meter in the state in which the acceleration voltage (HV) is fixed as −1800 V. Further, the multi-functional temperature control system 43 inputs the signal for controlling the filament current value to the thyristor 48 so that the emission current value is 10.7 A. The filament power supply 41 controls the emission current value to be 10.7 A by the input signal from the thyristor 48. Further, the back surface temperature of the substrate stage is increased so as to be the set temperature (for example, 1590° C.) using the emission current value of 10.7 A over a short period of time.

Further, when the back surface temperature of the substrate stage becomes 1590° C., the filament power supply 41 compares with the current value of the emission ampere meter 47 by the input signal passing through the sequencer 49, the multi-functional temperature control system 43, and the thyristor 48. In addition, the filament power supply 41 controls the filament current value so that the emission current value is the set value (for example, 9.8 A) to increase the temperature up to the set temperature (for example, 1640° C.). In this case, the acceleration voltage (HV) is constantly maintained at −1800 V as it is.

Next, the emission current value is maintained at the set value (for example, 7.7 A) to perform the heating for the set time (for example, 3 minutes). Further, the emission current value is maintained at the set value (for example, 7.5 A) to perform the heating for the set time (for example, 2 minutes). In this case, the highest temperature was 1710° C.

Next, in the state in which the filament current value is limited to the set value (for example, up to 20 A) so as not to discharge the emission current, the distance between the upper surface of the substrate stage 20 and the radiating surface 11a of the heating container 11 is extended to perform the cooling.

When the measured temperature of the side of the heater reaches the set temperature (for example, 1200° C.) by the dichroic radiation thermometer 7, the distance between the upper surface of the substrate stage 20 and the radiating surface 11a of the heating container 11 is further extended. Further, the upper surface of the substrate stage 20 and the radiating surface 11a of the heating container 11 are separated from each other by the water cooling shutter 24. As such, radiant heat from the heater 10 does not affect the carrying robot arm to perform the carrying-in/out of the treated substrate 21.

During this, the input power is subjected to a PID control so that the side temperature of the heater reaches 1200° C. by standby heating. In this case, when the heater power is turned-off at the time of cooling, the heating-up start at the time of the next standby heating is remarkably delayed, thereby causing the deterioration in the temperature reproducibility or the degradation in the throughput.

Next, the anneal processing process of activating impurities by ion implantation of the substrate (carbon carbide substrate) with impurities and then, anneal-treating the substrate is performed. The power supply power is controlled so that the treated substrate 21 is mounted on the substrate stage 20 and then, the emission current value is the predetermined value (for example, 3 A) to perform the gas emission of the substrate 21 until the back surface temperature of the substrate stage reaches the set temperature (for example, 1200° C.) and prevent the deterioration in the surface flatness.

Further, the heating-up is suddenly made by the emission current value to the set value (for example, 10.2 A), the emission current value is reduced stepwise, and the heating is held at the predetermined value (for example, 7.1 A).

After the anneal holding time (for example, 1 minute) ends, the filament current value is limited to the set value (for example, 20 A) and the distance between the upper surface of the substrate stage 20 and the radiating surface 11a of the heating container 11 is extended to cool the treated substrate 21. When the back surface temperature of the substrate stage reaches the set temperature (for example, 1200° C.), the substrate stage 20 descends and the water cooling shutter 24 is closed. Further, the slit valve 22 is opened, the treated substrate 21 is carried out by the carrying robot, and the next treated substrate 21 is carried in. The plurality of treated substrate 21 is sequentially treated by repeating the series of processes as described above.

According to the present invention, even when the annealing treatment is performed at a high temperature, it is possible to secure the equivalent qualities of substrates on the first sheet of substrate and the next sheet of substrate. As such, equivalently maintaining the qualities of the substrates is considered due to the following reason.

That is, according to the present invention, in the preheating, the heating is made at a higher temperature than the annealing treatment temperature, such that the gas amount emitted from the inner wall of the treatment container or the internal components may be reduced at the time of the annealing treatment. This is because the gas emission depends on the temperature, such that gas may be more easily emitted at a high temperature.

The inside of the heating container 11 of the electron impact heating apparatus 1 is maintained at a high vacuum state, such that when gas is emitted to the heating container 11, a vacuum degree within the heating container 11 may be temporarily reduced, the electron emission from the filament 14 cannot be controlled, and spark may occur. As a result, the heater temperature is changed or in severe cases, the heating stops.

Meanwhile, in the present invention, the temperature of the preheating process is set to be the higher temperature than the real annealing treatment temperature in advance, such that the gas emission from the heating container 11 occurs during the preheating. Therefore, in the annealing treatment process, the occurrence of gas emission may be reduced and in the annealing treatment, the heating-up speed is rapid and may be controlled within a predetermined range.

Further, the productivity of the silicon carbon (SiC) device may be remarkably improved by increasing the reproducibility of the annealing treatment temperature and remarkably improving the throughput of the annealing treatment by the electron impact heating apparatus 1.

The preferred embodiment of the present invention has been described above, but the present invention is not limited to the above embodiment and can be variously changed within the technical scope understood from the description of the claims.

EXAMPLES

Hereinafter, the temperature control method of the substrate heat treating apparatus according to the present invention will be described in more detail with reference to Examples, but the present invention is not limited to the Examples.

Example 1

Example 1 describes a case of manufacturing a semiconductor device by using the temperature control method including the preheating of the present invention using the electron impact heating apparatus 1 of FIGS. 1 and 2.

The electron impact heating apparatus 1 of the present invention is provided with a load lock chamber (not illustrated) accommodating a cassette in which the plurality of treated substrates 21 are received and a transfer chamber (not illustrated) connecting the load lock chamber with the electron impact heating apparatus 1.

First, the cassette made of quartz receives ten sheets of carbon carbide substrates (SiC substrates) and is received in the load lock chamber and the inside of the load lock chamber is exhausted. The exhaust of the load lock chamber starts and the preheating process starts. Further, roughing of the load lock chamber ends while the preheating process is performed.

Next, the slit valve that is a barrier rib between the transfer chamber and the load lock chamber is opened and the load lock chamber is exhausted by a turbomolecular pump (TMP) of the transfer chamber until a pressure of the transfer chamber is $1 \times 10^{-3}$ Pa or less.

As described above, the preheating process (dummy anneal) is a process of previously increasing the temperature within the treatment container including the heater 10 and the substrate stage 20. In detail, the substrate stage 20 ascends without using the dummy substrate, such that the distance between the upper surface of the stage 20 and the radiating surface 11a of the closed end of the heating container 11 is 5 mm so as to approach each other. Further, the back surface temperature of the substrate stage 20 is set to be 1710° C. that is the higher temperature than the real annealing treatment temperature of 1575° C. and the substrate stage is heated over the longer period of time (four minutes) than the real treating time (1 minute) and is held.

Here, the preheating process of the present Example will be described in detail with reference to FIG. 3.

First, the absorption gas is emitted to the filament 14 by performing the filament heating to prevent the deterioration in the filament 14. In detail, the signal is input from the sequencer 49 to the multi-functional temperature control system 43 and the filament current value is increased as much as 1 A for each 1 second until the current value of the filament ampere meter 45 is 30 A. The multi-functional temperature control system 43 compares the signal from the sequencer 49 with the return signal from the filament ampere meter 45 and outputs the signal to the thyristor 48. The filament power supply 41 slowly increases the output of the filament current value according to the input from the thyristor 48 and heats the filament 14 until the current value of the filament ampere meter 45 reaches 30 A.

Next, the acceleration power supply 42 applies the acceleration voltage (HV) to the filament 14 to slowly increase voltage, such that the sudden increase in the emission current value is prevented and the abnormal discharge is prevented. The signal is output from the sequencer 49 to the thyristor 48 and the acceleration voltage (HV) of −500 V is applied, in the state in which the filament current value is fixed as 30 A. The acceleration power supply 42 applies the acceleration voltage (HV) of, for example, −500 V to the filament 14 according to the input from the thyristor 48. Further, the sequencer 49 outputs the signal to the thyristor 48 and increases the acceleration voltage (HV) as much as −100 V for each 1 second so that the acceleration voltage (HV) reaches −1800 V. The acceleration power supply 42 slowly increases the output of the acceleration voltage (HV) according to the input of the thyristor 48 and generates the emission current so that the acceleration voltage (HV) reaches −1800 V.

Further, the signal of which the emission current value is 10.7 A is input from the sequencer 49 to the multi-functional temperature control system 43. The multi-functional temperature control system 43 compares with the output signal from the emission ampere meter in the state in which the acceleration voltage (HV) is constantly maintained at −1800 V and inputs the signal for controlling the filament current value to the thyristor 48 so that the emission current value reaches 10.7 A. The filament power supply 41 controls the emission current value so as to be 10.7 A, by the input signal from the thyristor 48. Further, the back surface temperature of the substrate stage 20 is increased so as to be 1590° C. using the emission current value of 10.7 A over a short period of time.

Further, when the back surface temperature of the substrate stage 20 reaches 1590° C., the filament power supply 41 compares with the current value of the emission ampere meter 47 by the input signal passing through the sequencer 49, the multi-functional temperature control system 43, and the thyristor 48. Further, the filament power supply 41 controls the filament current value so that the emission current value is 9.8 A, thereby increasing a temperature up to 1640° C. In this case, the acceleration voltage (HV) is constantly maintained at −1800 V as it is.

Next, the heating is made for 3 minutes at the emission current value of 7.7 A. Further, the heating is made for 2 minutes at the emission current value of 7.5 A. Since the highest arrival temperature is changed by the temperature of the heater 10 or the substrate stage 20 in the heating initial stage, the heating control thereof does not trigger the temperature but the power control in which time is fixed is performed. Therefore, regardless of the temperature of the initial stage, the dummy anneal process may be performed with good reproducibility. In this case, the highest temperature was 1710° C.

Next, in the state in which the filament current value is limited to 20 A so as not to discharge the emission current, the distance between the upper surface of the substrate stage 20 and the radiating surface 11a of the heating container 11 is set to be 72 mm to perform the cooling.

When the back surface temperature of the substrate stage 20 reaches 1200° C. by the dichroic radiation thermometer 7, the distance between the upper surface of the substrate stage 20 and the radiating surface 11a of the heating container 11 is extended up to 198 mm. Further, the water cooling shutter 24 closes between the upper surface of the substrate stage 20 and the radiating surface 11a of the heating container 11 and the radiant heat from the heater 10 does not affect the carrying robot arm to perform the carrying in/out of the SiC substrate.

During this, the input power is subjected to the PID control so that the side temperature of the heating container reaches 1200° C. by the standby heating. In this case, when the heater power is turned-off at the time of cooling, the heating-up start at the time of the next standby heating is remarkably delayed, thereby causing the deterioration in the temperature reproducibility or the degradation in the throughput.

Further, in the standby heating, the back surface temperature of the substrate stage cannot be measured by the water cooling shutter, such that the side temperature of the heater is measured.

After the SiC substrate is mounted on the substrate stage 20, the power supply power is controlled so that the emission current value is 3 A to perform the gas emission until the back surface temperature of the substrate stage 20 reaches about 1200° C. for 90 seconds and prevent the deterioration in the surface flatness. Next, the heating-up is suddenly made at the emission current value of 10.2 A, and is made at the emission current value of 9.5 A between 1515° C. and 1535° C. that are the back surface temperatures of the substrate stage, and the emission current value of 8.4 A between 1535° C. and 1555° C. that are the back surface temperatures of the substrate stage. Further, the heating-up is made at the emission current of 7.3 A between 1555° C. and 1575° C. that are the back surface temperature of the substrate stage and the heating is made and held at the emission current value of 7.1 A for 1 minute at 1575° C. Here, using the back surface temperature of the substrate stage as a contact, the emission current value is reduced stepwise, such that the high temperature may be rapidly and stably controlled even in a large caliber heater having a diameter of $\phi$ 200 mm.

After the anneal holding time for 1 minute ends, the filament current value is limited to 20 A and the distance between the upper surface of the substrate stage 20 and the radiating surface 11a of the heating container 11 is extended up to 72 mm to cool the SiC substrate. When the back surface temperature of the substrate stage reaches 1200° C., the substrate stage 20 descends so that the distance between the upper surface of the substrate stage 20 and the radiating surface lie of the heating container 11 is 198 mm. Further, the water cooling shutter 24 is closed, the slit valve 22 is opened, the SiC substrate is carried out by the carrying robot, and the next SiC substrate is carried in. During this, the side temperature of the heater 10 is measured by the radiation thermometer and the heater temperature is held by controlling power so that the side temperature of the heater 10 is 1200° C. by the standby heating.

The plurality of SiC substrates is sequentially treated by the same process and after the treating of the final tenth sheet of substrate completes, the substrate is recovered to the load lock chamber to end the standby heating and complete a series of processing.

Figure 5:
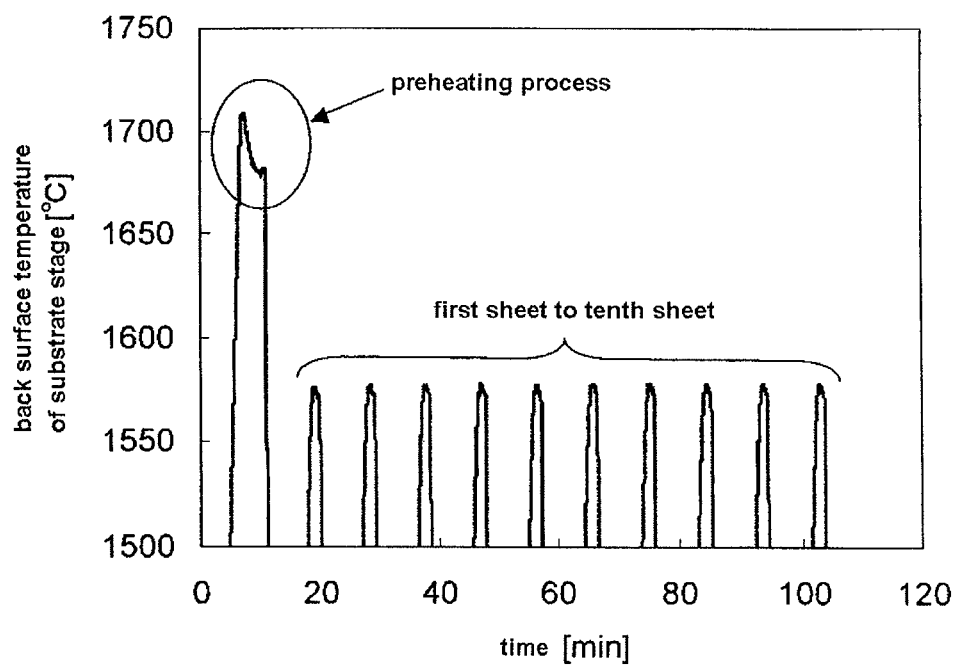
FIG. 5 is an enlarged view of FIG. 4.

In this case, the relationship between the back surface temperature and the treating time of the substrate stage is illustrated in FIG. 4 and the enlarged view thereof is illustrated in FIG. 5. According to the present Example, the treating time is one hour and 47 minutes and the throughput of 5 sheets/hour or more can be achieved. In this case, the highest temperature difference is +3° C. and the lowest temperature difference is −4° C., at the anneal holding temperature of 1575° C. in all the 10 sheets of SiC substrates, such that it can be appreciated that the temperature reproducibility is sufficiently secured and the qualities of the substrates are held.

EXPLANATION OF REFERENCE NUMERALS

1 Substrate heat treating apparatus (electron impact heating apparatus)
3 Treatment container
10 Heating apparatus
11 Heating container
14 Filament
21 Treated substrate
24 Shutter mechanism
42 Acceleration power supply

The invention claimed is:

1. A temperature control method of a substrate heat treating apparatus including a conductive heating container mounted with a filament within a vacuum exhaustible treatment container and applying acceleration voltage between the filament and the heating container to accelerate thermal electrons generated from the filament and collide the accelerated thermal electrons with the heating container to heat the heating container, and performing an annealing treatment on a substrate by heat generated from the heating container, the temperature control method comprising:
   performing preheating for heating an inside of the treatment container at a higher temperature than an annealing treatment temperature of the substrate and over a longer period of time than an annealing treatment time and then, cooling the inside of the treatment container to a temperature lower than the annealing treatment temperature, prior to carrying the substrate in the treatment container; and
   carrying the substrate in the preheated treatment container and then, increasing a temperature of the treatment container to the annealing treatment temperature to perform the annealing treatment.

2. A manufacturing method of a semiconductor device including ion implantation of impurities into a silicon carbide substrate and an annealing treatment of the silicon carbide substrate to activate the impurities, the method comprising:
   controlling temperature by the temperature control method including the preheating according to claim 1 to perform the annealing treatment.

3. A substrate heat treating apparatus including a conductive heating container mounted with a filament within a vacuum exhaustible treatment container and applying acceleration voltage between the filament and the heating container to accelerate thermal electrons generated from the filament and collide the accelerated thermal electrons with the heating container to heat the heating container, and performing an annealing treatment on a substrate by heat generated from the heating container, the substrate heat treating apparatus allowing a control device of the substrate heat treating apparatus to execute:
   an order of performing preheating for heating an inside of the treatment container at a higher temperature than an annealing treatment temperature of the substrate and over a longer period of time than an annealing treatment time and then, cooling the inside of the treatment container to a temperature lower than the annealing treatment temperature, prior to carrying the substrate in the treatment container; and
   an order of carrying the substrate in the preheated treatment container and then, increasing a temperature of the treatment container to the annealing treatment temperature to perform the annealing treatment.

4. The substrate heat treating apparatus according to claim 3, which heat treats the substrate by heat generated from a radiating surface of the heating container, the substrate heat treating apparatus further comprising:
   a substrate stage on which the substrate is mounted;
   an elevation device that elevates at least one of the substrate stage and the heating apparatus so as to approach or space the substrate stage to and apart from the radiating surface of the heating container within the treatment container; and
   a control system including at least the control device controlling components and a sequencer.

5. The substrate heat treating apparatus according to claim 4, further comprising:
   a shutter mechanism that partitions the substrate stage and the radiating surface of the heating container by a shutter, wherein the control device measures the temperature of the heating container by a radiation thermometer in a state in which the substrate stage and the radiating surface of the heating container are separated from each other by the shutter when carrying the substrate and controls temperature based on the measured temperature for a temperature control of standby heating.

6. The substrate heat treating apparatus according to claim 5, wherein the shutter is a water cooling shutter.

* * * * *